United States Patent
Warren et al.

(10) Patent No.: US 10,257,959 B2
(45) Date of Patent: Apr. 9, 2019

(54) METHOD AND APPARATUS FOR MONITORING ELECTROMECHANICAL DEVICE PERFORMANCE AND RELIABILITY

(75) Inventors: Dewight L. Warren, McKinney, TX (US); Neil D. Longgood, Carrollton, TX (US); Kerry D. Lacanette, Tucson, AZ (US)

(73) Assignee: Maxim Integrated Products, Inc., San Jose, CA (US)

( * ) Notice: Subject to any disclaimer, the term of this patent is extended or adjusted under 35 U.S.C. 154(b) by 703 days.

(21) Appl. No.: 13/332,354

(22) Filed: Dec. 20, 2011

(65) Prior Publication Data

US 2013/0156576 A1   Jun. 20, 2013

(51) Int. Cl.
| | |
|---|---|
| H05K 7/20 | (2006.01) |
| F04D 19/00 | (2006.01) |
| F04D 27/00 | (2006.01) |
| G06F 11/30 | (2006.01) |

(52) U.S. Cl.
CPC ....... *H05K 7/20172* (2013.01); *F04D 19/002* (2013.01); *F04D 27/001* (2013.01); *F04D 27/004* (2013.01); *F04D 27/008* (2013.01); *G06F 11/3058* (2013.01)

(58) Field of Classification Search
CPC .... F04D 19/002; F04D 27/001; F04D 27/004; F04D 27/008
USPC .......... 417/18, 22, 42, 53, 63, 423.7, 44.11; 318/599; 416/36, 1, 61, 35, 40; 700/282
See application file for complete search history.

(56) References Cited

U.S. PATENT DOCUMENTS

| | | | | |
|---|---|---|---|---|
| 5,777,897 | A * | 7/1998 | Giorgio | 700/299 |
| 5,930,736 | A * | 7/1999 | Miller | H02P 7/2815 |
| | | | | 318/471 |
| 6,008,603 | A * | 12/1999 | Jones et al. | 318/400.32 |
| 6,188,189 | B1 * | 2/2001 | Blake | 318/471 |
| 6,340,874 | B1 * | 1/2002 | Vladimir | 318/471 |
| 6,381,406 | B1 * | 4/2002 | Smith et al. | 318/799 |
| 6,597,972 | B2 * | 7/2003 | Emberty et al. | 700/304 |
| 6,801,004 | B2 * | 10/2004 | Frankel et al. | 318/268 |
| 7,095,188 | B1 * | 8/2006 | Lin | 318/400.12 |

(Continued)

FOREIGN PATENT DOCUMENTS

| | | |
|---|---|---|
| CN | 101004180 A | 7/2007 |
| CN | 101063887 A | 10/2007 |
| CN | 101749259 A | 6/2010 |

OTHER PUBLICATIONS

Milks, Intelligent Fan Conrol, Microchip Technology Inc., Microchip AN1178, 2008.*

(Continued)

*Primary Examiner* — Charles Freay
*Assistant Examiner* — Lilya Pekarskaya
(74) *Attorney, Agent, or Firm* — TIPS Group

(57) ABSTRACT

Methods and apparatus for monitoring air cooling fans including, by way of non-limiting examples, the determination of an upper and lower boundary limit of acceptable fan operation, sends a control signal to a fan being monitored, measures the fan rotation rate or fan power consumption subsequent to sending the control signal; and issues an alarm if the measured fan rotation rate is above the upper boundary limit or below the lower boundary limit.

11 Claims, 13 Drawing Sheets

(56) References Cited

U.S. PATENT DOCUMENTS

| | | | |
|---|---|---|---|
| 7,142,125 B2* | 11/2006 | Larson | F04D 27/004 |
| | | | 310/52 |
| 7,151,349 B1* | 12/2006 | Williamson et al. | 318/400.37 |
| 7,397,166 B1* | 7/2008 | Morgan et al. | 310/328 |
| 7,583,043 B2* | 9/2009 | Chung | G05D 23/1917 |
| | | | 318/471 |
| 7,701,158 B2* | 4/2010 | Wu et al. | 318/268 |
| 8,145,926 B2* | 3/2012 | Park et al. | 713/320 |
| 2002/0120367 A1 | 8/2002 | Emberty et al. | |
| 2003/0091441 A1* | 5/2003 | Huang et al. | 417/42 |
| 2003/0173915 A1* | 9/2003 | Lee et al. | 318/268 |
| 2005/0107892 A1* | 5/2005 | Matsui et al. | 700/28 |
| 2005/0254959 A1* | 11/2005 | Furuta et al. | 417/46 |
| 2006/0152891 A1* | 7/2006 | Jreij et al. | 361/676 |
| 2007/0145835 A1* | 6/2007 | Yukitake | H02H 7/0833 |
| | | | 310/53 |
| 2007/0297893 A1* | 12/2007 | Alon | F04D 25/166 |
| | | | 415/47 |
| 2008/0310967 A1* | 12/2008 | Franz et al. | 417/32 |
| 2009/0009967 A1* | 1/2009 | Nishizawa et al. | 361/695 |
| 2010/0076728 A1* | 3/2010 | Yanao | 702/183 |
| 2011/0090087 A1* | 4/2011 | Berke et al. | 340/584 |

OTHER PUBLICATIONS

Data Sheet, MAXIM MAX31785 6-Channel Intelligent Fan Controller Preliminary, May 27, 2010, pp. 1-45.

* cited by examiner

METHOD AND APPARATUS FOR MONITORING ELECTROMECHANICAL DEVICE PERFORMANCE AND RELIABILITY

BACKGROUND

In many current electronic devices, such as high performance computer servers for example, air cooling remains the predominant method for removing heat and keeping temperatures within acceptable limits. Natural convection cannot provide the necessary heat transfer for high power CPUs (computer processing units) and GPUs (graphics processing units) due to the large heat sink area required, so forced convection using fans remains the dominant solution for cooling for such systems.

Cooling fans, being rotating electromechanical devices typically have an electrical motor and fan blades, are prone to failure. When they do fail, they can take down entire systems by allowing the systems to overheat and thereby damaging or destroying heat-sensitive components. Furthermore, their performance can degrade over time, causing a slow decrease in system performance resulting in increased temperatures. Also, dust and dirt build up on the fan blades can slow their rotation rate, reduce air flow from the fan, and create fan blade imbalances that increase bearing wear. Bearing lubricants can dry-up, resulting in increased friction and power consumption, and eventually motor failure.

Given their potential for failure and diminished performance over time, it can be important, from a system reliability standpoint, to monitor fan performance and predict the potential failure of these devices. Prior art systems have generally relied upon the monitoring of fan rotation rates (RPM), indicating a fault when the rotation rate falls below a fixed RPM threshold.

FIG. 1 is a graph 100 of fan speed versus time for a prior art system for detecting fan failures. Curve 102 illustrates how fan speed may decrease over time, finally dropping below fixed threshold 104 at point 106. This system may have limited suitability for fans run continuously at full power or maximum rotational rate.

Most modern systems run fans at varying rotation speeds, depending on the heat generated by the load being cooled, moderated by concerns for noise. To reduce the noise produced by the fans, they may be throttled-back when the systems being cooled are idle or are at low power consumption levels. A fixed threshold for determining potential fan failure may be impractical or unsuitable for such systems. What is desirable is a fan monitoring system that can determine whether a fan is operating within specified limits throughout its operating range, with the potential to predict fan failures before they occur so that preventative action can be taken.

These and other limitations of the prior art will become apparent to those of skill in the art upon a reading of the following descriptions and a study of the several figures of the drawing.

SUMMARY

In an embodiment, set forth by example and not limitation, a method for monitoring air cooling fans includes determining a first upper boundary limit of acceptable operation, determining a first lower boundary limit of acceptable operation, sending a control signal to a fan, measuring a fan rotation rate subsequent to sending the control signal, and issuing an alarm if the measured fan rotation rate is above the upper boundary limit or below the lower boundary limit.

In another embodiment, set forth by example and not limitation, a method for monitoring air cooling fans includes determining a first upper boundary limit of acceptable operation, determining a first lower boundary limit of acceptable operation, sending a control signal to a fan, measuring a fan power consumption subsequent to sending the control signal, and issuing an alarm if the measured fan power consumption is above the upper boundary limit or below the lower boundary limit.

In a further embodiment, set forth by example and not limitation, a method for monitoring electromechanical devices includes determining a first upper boundary limit of acceptable operation, determining a first lower boundary limit of acceptable operation, sending a control signal to the electromechanical device, measuring a response variable subsequent to sending the control signal, and issuing an alarm if the measured response variable is above the upper boundary limit or below the lower boundary limit.

In yet a further embodiment, set forth by way of example and not limitation, an apparatus for monitoring electromechanical devices includes a microcontroller, an output module coupled to the microcontroller, a measurement module coupled to the microcontroller, and digital memory coupled to the microcontroller. In an example embodiment, the digital memory includes a first upper boundary limit of acceptable operation, a first lower boundary limit of acceptable operation, code segments for sending a control signal to an electromechanical device via said output module, code segments measuring a response variable subsequent to sending said control signal, and code segments issuing a first alarm if said measured response variable is above said upper boundary limit or below said lower boundary limit.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
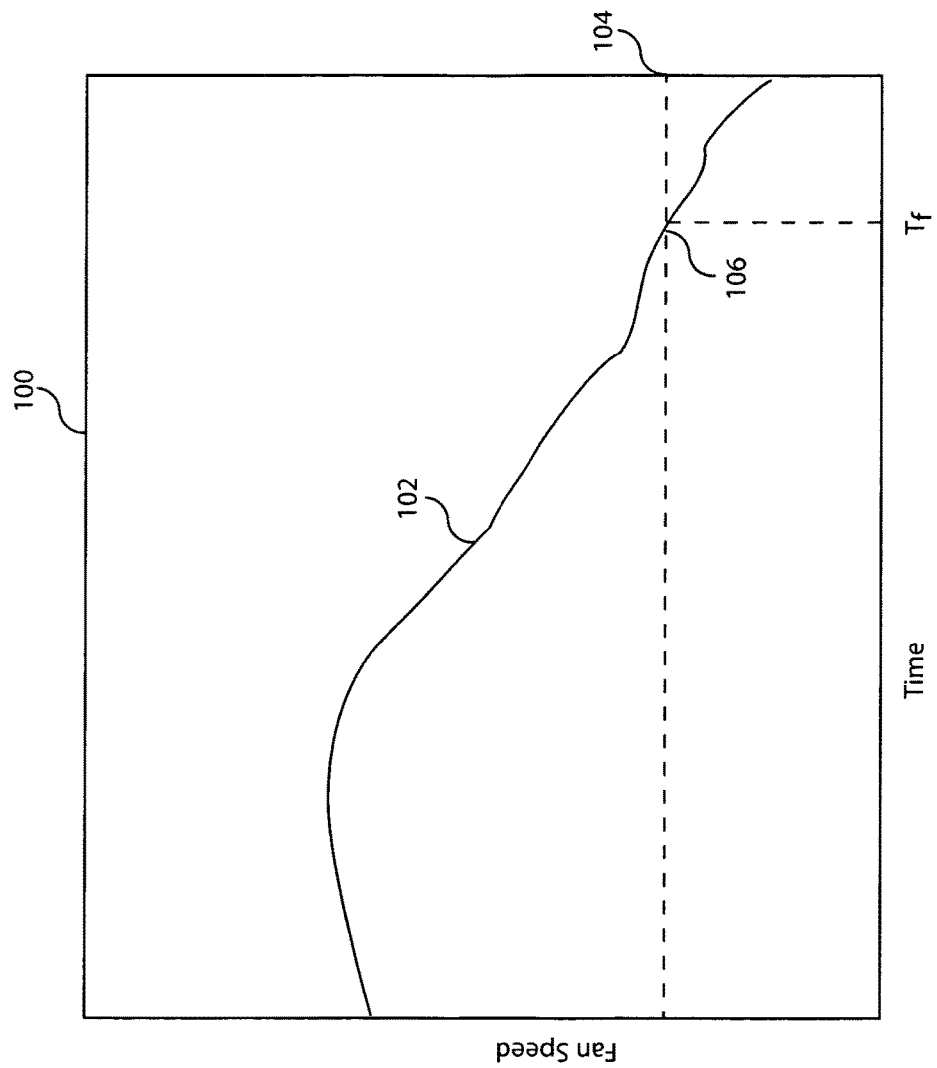
FIG. 1 is a graph of fan speed versus time for a prior art system for detecting fan failures.
Figure 2A:
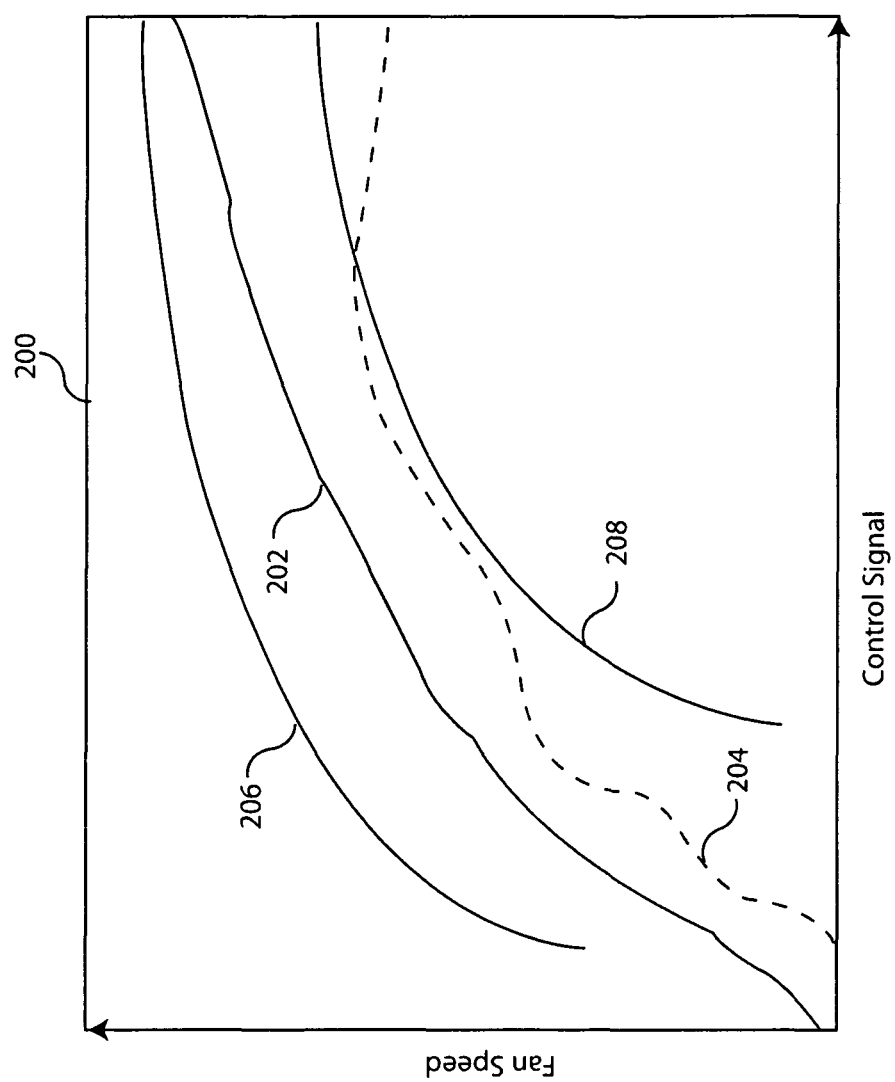
FIG. 2a is a graph of fan speed versus fan control signal for an example fan health monitoring system.

FIG. 1 was discussed with reference to the prior art. FIG. 2a is a graph 200 of fan speed versus fan control signal for a fan health monitoring system, set forth by way of example and not limitation. The example system is so named because is operative to diagnose fan operation and predict a potential impending failure condition, as opposed to detecting a fan that has already failed or reached a condition where it is no longer suitable for operation. The "Fan Control Signal", the independent variable plotted in FIG. 2a, is the signal causing the fan to rotate. It can be a pulse width modulated (PWM) signal commonly used with 4 wire fans, or an analog voltage signal commonly used with 3 wire fans.

With continuing reference to FIG. 2a, curve 202 illustrates how a properly operating example fan will vary its rotational speed (Fan Speed) as a function of the Control Signal. Curve 202 can also be referred to as the fan's characteristic curve or transfer function. The specific shape of curve 202 may vary depending on the type of fan and variables surrounding the specific application. Curves 206 and 208 represent boundaries of acceptable operation. Even though shape of the characteristic curve 202 may vary, as long as it remains between the limits imposed by boundary curves 206 and 208, its operation is considered acceptable.

Dashed curve 204 represents a characteristic curve of an example fan that is no longer operating in an acceptable manner as its characteristic curve has extended beyond the limits imposed by boundary 208. It should be noted that fan operation outside of the boundary limits imposed by curves 206 and 208 may or may not indicate a fan failure, since these limits can be chosen to allow proper system cooling even if a fan's characteristic curve extends outside a boundary limit. In this event, the example fan health monitoring system would issue an alarm or warning to system operators, who can plan to repair or replace the fan in a timely manner. Boundary curves 206, 208 can be derived from engineering data, system requirements, or by actual measurement of the fan operating curve or transfer function. If actual measurements are made, boundary curves can be computed from the characteristic curve data by using a suitable numerical correlation (such as a fixed percentage) or other suitable criteria.

Figure 2B:
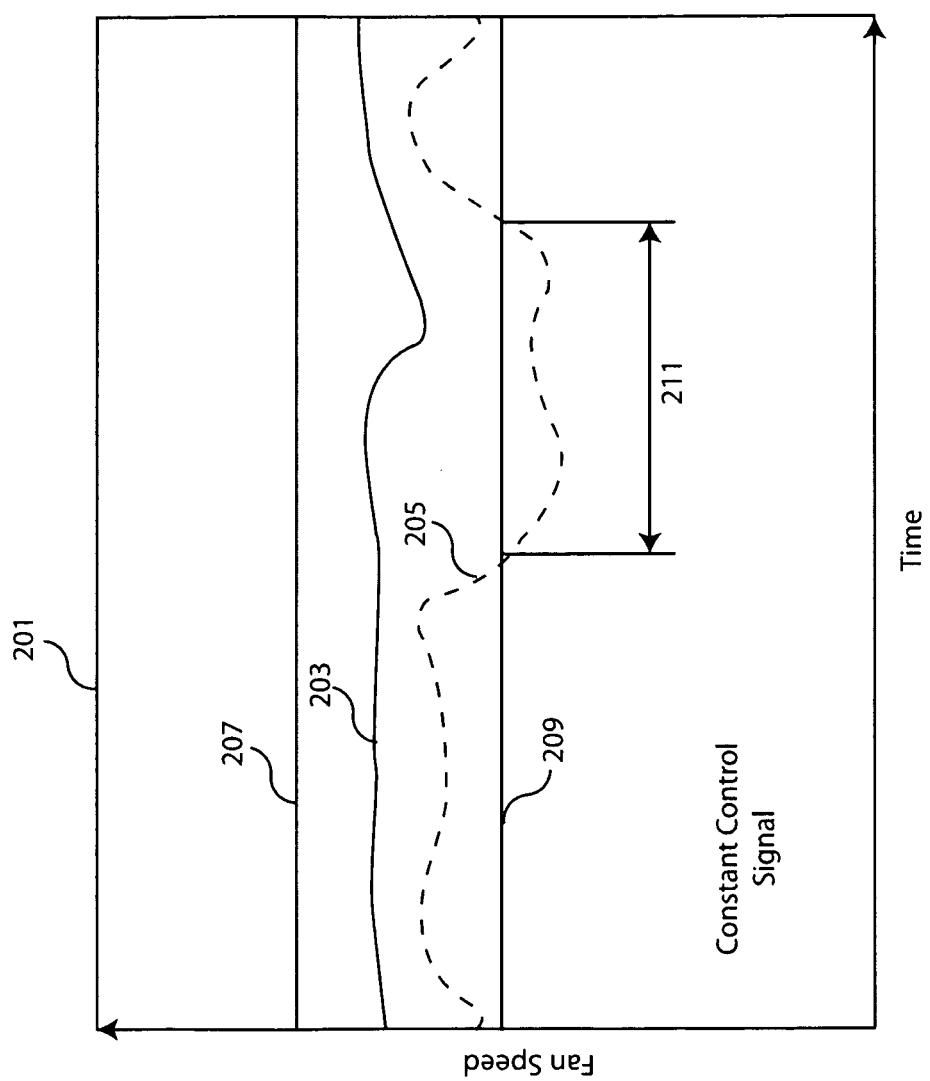
FIG. 2b is a graph of fan speed versus time for an example fan health monitoring system.

Another function useful for detecting potential fan failures is to hold the control signal constant and monitor fan speed as a function of time. FIG. 2b is a graph 201 of fan speed versus time for an example fan health monitoring system. A properly operating fan should maintain a constant rotational rate, within specified tolerances. These tolerances are represented by boundary limit curves 207 and 209 of FIG. 2. A properly operating fan is represented by curve 203, whose fan speed remains between limits 207 and 209. Dashed curve 205 represents a fan whose fan speed exceeds the limits imposed by curve 209. In this case an alarm or warning would be issued to allow system operators to take the appropriate action.

Figure 3:
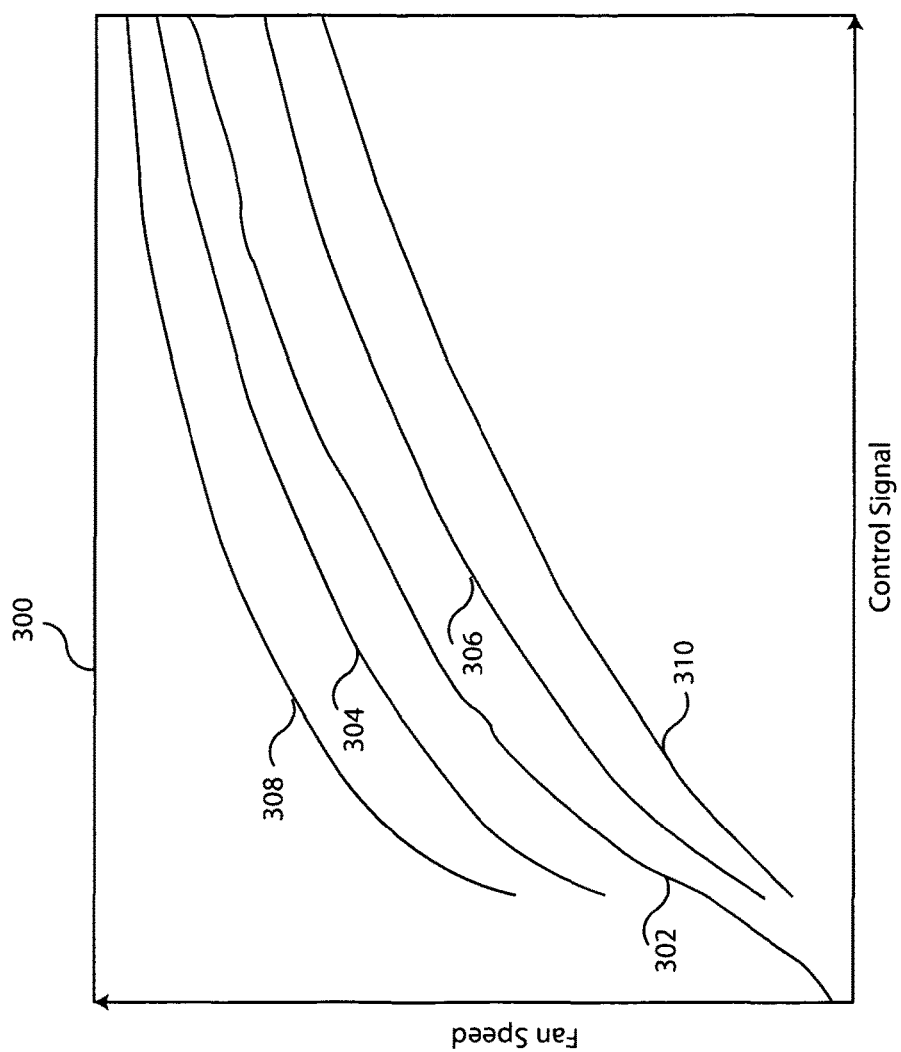
FIG. 3 is a graph of fan speed versus control signal for an example fan health monitoring system having a dual tier criteria for predicting potential fan failures.

FIG. 3 is a graph 300 of fan speed versus control signal for an example fan health monitoring system having a two tier criteria for predicting potential fan failures. Curve 302 represents a characteristic operating curve for a properly operating fan. Curves 304 and 306 represent the first tier boundary, similar to boundary curves 206 and 208 of FIG. 2a. Fans producing characteristic curves bounded by curves 304 and 306 are considered to be operating acceptably. A second set of curves 308 and 310 are also included in FIG. 3, which provide a second tier boundary. The two tier boundary criteria allows a graduated alarm response to be generated for fans whose characteristic operating curves extend across one or more boundaries. It should be acknowledged by those skilled in the art that although only two sets of boundary curves are illustrated in FIG. 3, any number of additional tiers could be added if desired.

Figure 4:
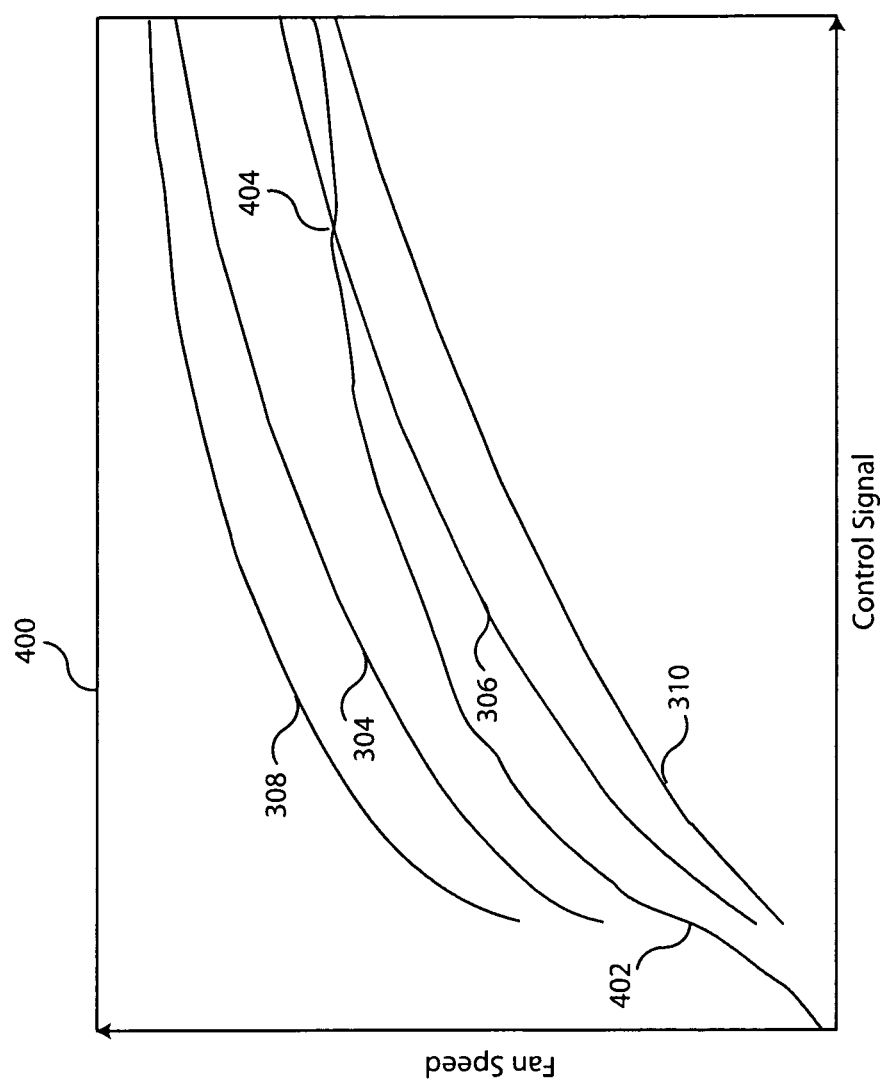
FIG. 4 is a graph of fan speed versus control signal for an example fan health monitoring system wherein a fan being monitored has exceeded the first tier criteria.

FIG. 4 is a graph 400 of an example fan speed versus control signal wherein a fan being monitored has exceeded the first tier criteria. Curve 402 represents the characteristic curve of a fan that has crossed first tier boundary curve 306 at point location 404, but not extended across second tier boundary curve 310. In this case, for example, a low level alarm can be issued warning the system operator that maintenance may be required if the fan performance worsens.

Figure 5:
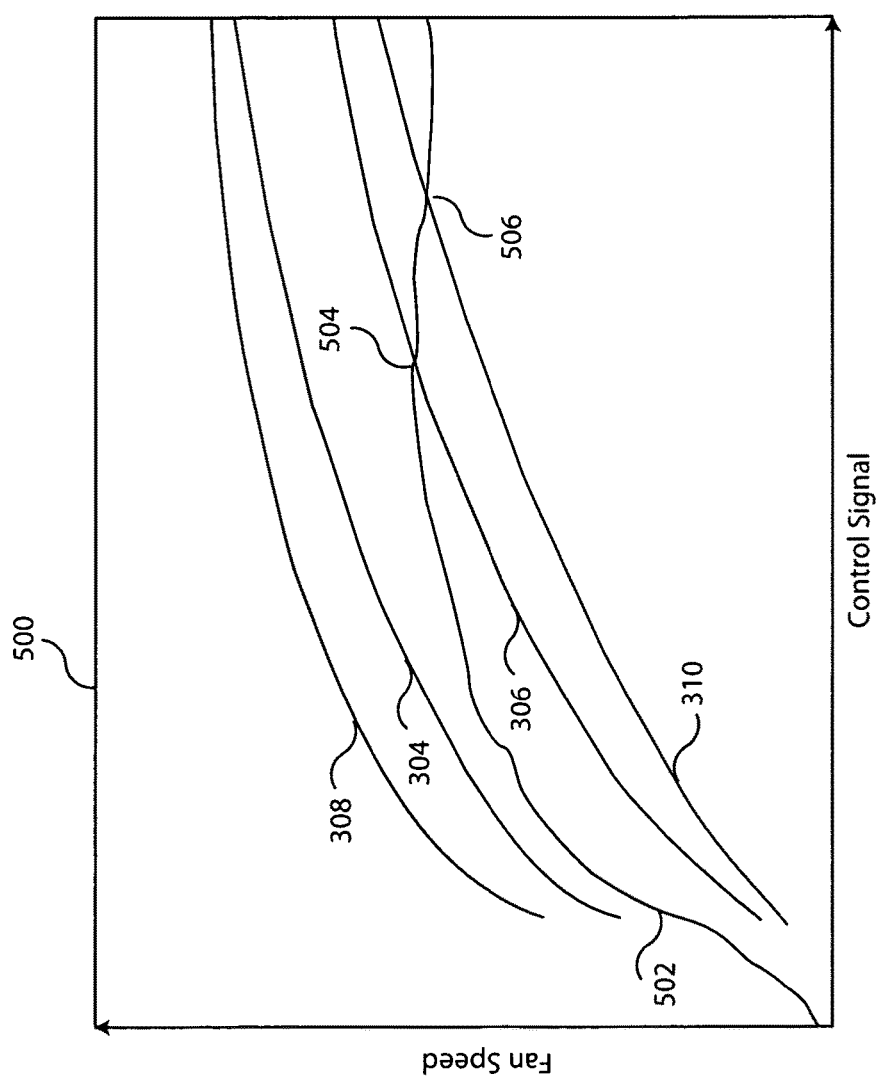
FIG. 5 is a graph of fan speed versus control signal for an example fan monitoring system wherein a fan being monitored has exceeded the second tier criteria.

FIG. 5 is a graph 500 of an example fan speed versus control signal wherein the characteristic curve 502 of a fan being monitored has crossed the first tier boundary curve 306 at location 504, and crossed the second tier boundary curve 310 at location 506. In this latter case, for example, a more urgent alarm can be issued requiring immediate or high priority corrective action. If additional tiers are added (not shown), then additional alarm levels can be provided, the responses progressively increasing in severity as fan performance extends across additional boundaries.

The characteristic curves shown in FIGS. 2a, 2b and 3-5 have, as examples, used fan speed as the monitored variable of fan performance. However, as another example the fan health monitoring system can use fan power, fan load current, measured air temperature or measured device substrate temperature as additional characteristic operating curves. These additional measured parameters can be used singly, or in conjunction with fan speed. As was illustrated with fan speed, tiered operational boundaries can be established for each additional measurement parameter, and alarms or warnings issued if fan performance exceeds boundary limits.

While discussion heretofore has been directed, by way of non-limiting examples, to air cooling fans, the same principles can be applied to other electromechanical devices from which characteristic operating curves can be generated. These include but are not limited to pumps, solenoid valves, and motors.

Figure 6:
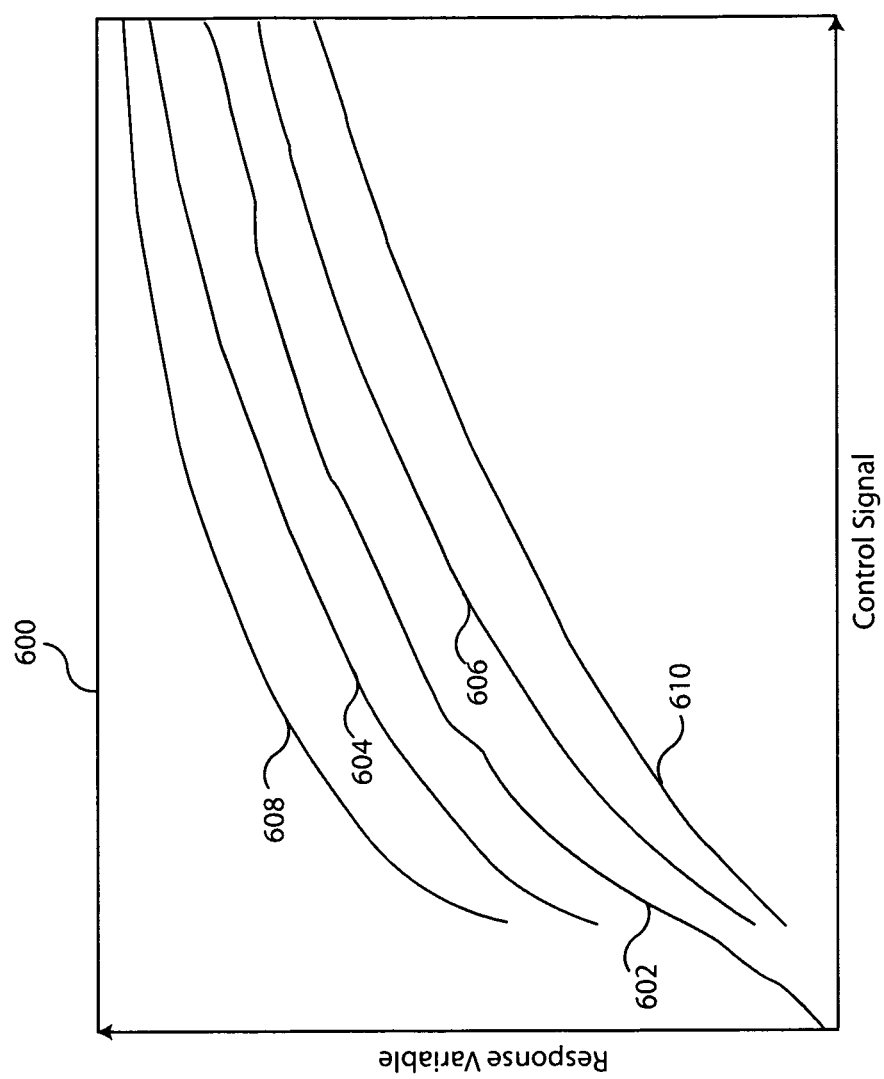
FIG. 6 is a graph of a response variable versus control signal for an example monitoring system for predicting potential failures of an electromechanical device.

FIG. 6 is a graph of a response variable versus control signal of an example monitoring system for predicting potential failures of an electromechanical device. Curve 602 represents the characteristic operating curve (or transfer function) of a properly operating example electromechanical device. Curves 604 and 606 represent the first tier boundary limits, and curves 608 and 610 represent second tier boundary limits. If, during operation, curve 602 should extend across one or more boundary curves 606-610, appropriate alarms or warnings can be issued to warn the user of impending failure.

Figure 7:
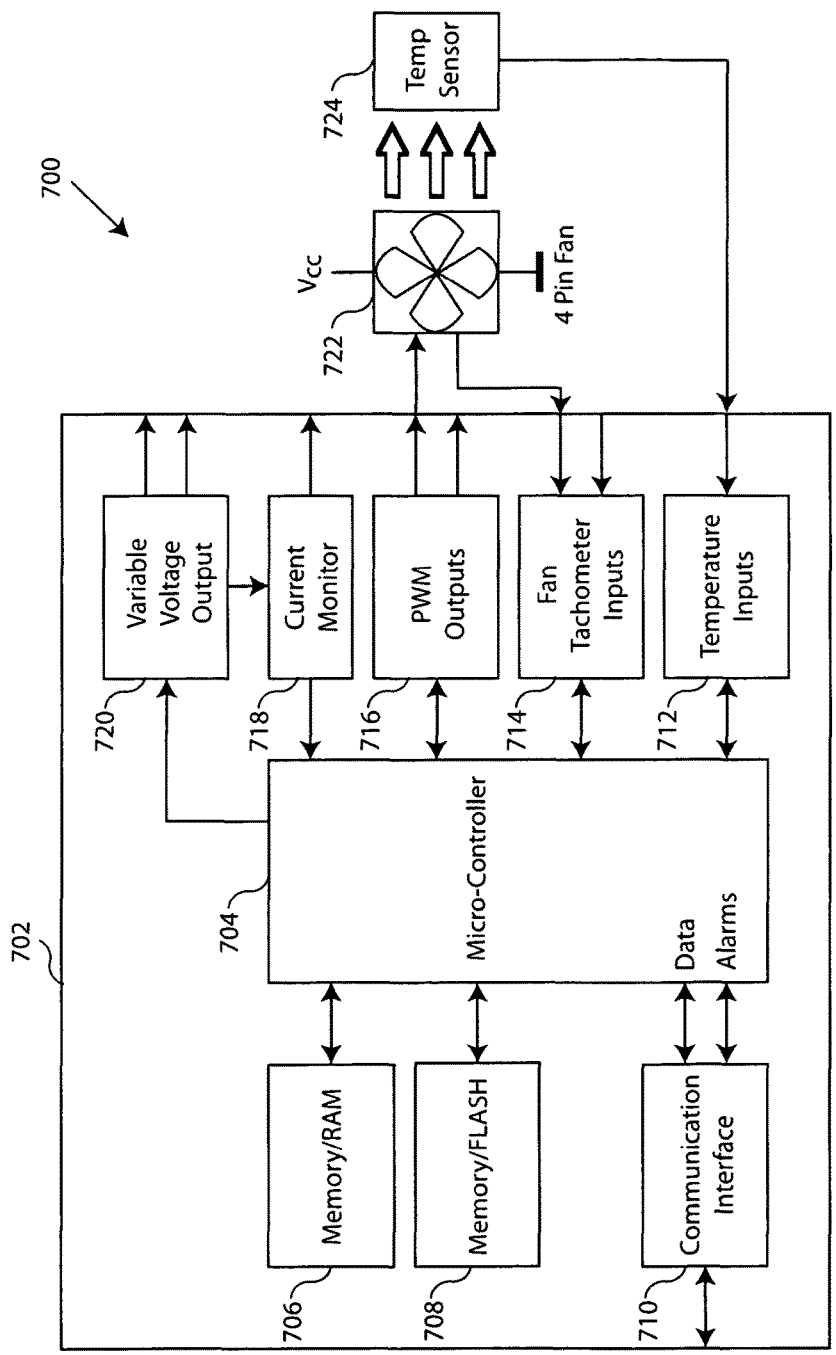
FIG. 7 is a block diagram of an example fan control device connected to a 4 wire fan.

FIG. 7 is a block diagram 700 of an example fan control device 702 connected to a 4 wire fan 722. Four wire fans generally have 4 connections (hence their name) including power, ground, a PWM input that controls fan speed, and a tachometer output that indicates fan speed or fan blade rotation rate. In this example, fan 722 has its power input connected to a fixed power bus $V_{cc}$, although alternatively it can be connected to modules 718 or 720 of fan control device 702 (to be discussed below).

Fan control device 702 contains a number of function modules in this non-limiting example. Central to the operation of example fan control device 702 is microcontroller 704 and, connected to microcontroller 704, are RAM memory module 706, flash memory module 708, communication interface module 710, temperature measurement module 712, fan tachometer input module 714, pulse width modulation (PWM) output module 716, load current measurement module 718, and analog voltage output module 720 by way of non-limiting examples.

As will be recognized by those skilled in the art, not all of the aforementioned modules of fan control device 702 are required for basic monitoring of a 4 wire fan, but are included to demonstrate the flexibility of additional example fan health monitoring functions. Furthermore, it will be recognized that other functions, such as closed loop control of fan speed (as a function of load temperatures or other criteria such as data input to communication interface 710) may also be performed by fan control device 702.

By way of non-limiting example, basic fan monitoring can be accomplished by comparing fan tachometer inputs (fan speed) received at module 714 with the PWM output sent to fan 722 via module 716, creating a characteristic operating curve. Microcontroller 704 compares operating data from fan 722 with boundary curve data stored in memory modules 706, 708. If the operating data exceeds tier 1 or tier 2 boundary limits, an appropriate alarm or warning is issued via communication interface module 710 to the system user.

Boundary curve data can be pre-programmed into flash memory module 708 at the time that the control device 702 is manufactured, or first placed into service, or at a later time through communication via module 710. Alternatively, microcontroller 704 can be programmed to generate a characteristic curve from a fan actually connected to control device 702, and have boundary curves generated from the experimentally derived characteristic curve using pre-programmed or user supplied criteria.

In another example, temperature data from a temperature sensor 724 may be utilized as another response variable, to be combined with the PWM output to create another characteristic curve or transfer function. Monitoring this second variable may be carried out in parallel with monitoring the fan speed, or may be carried out as the sole measurement. The temperature data may come from air temperature measurements or from substrate temperatures of devices being cooled.

Figure 8:
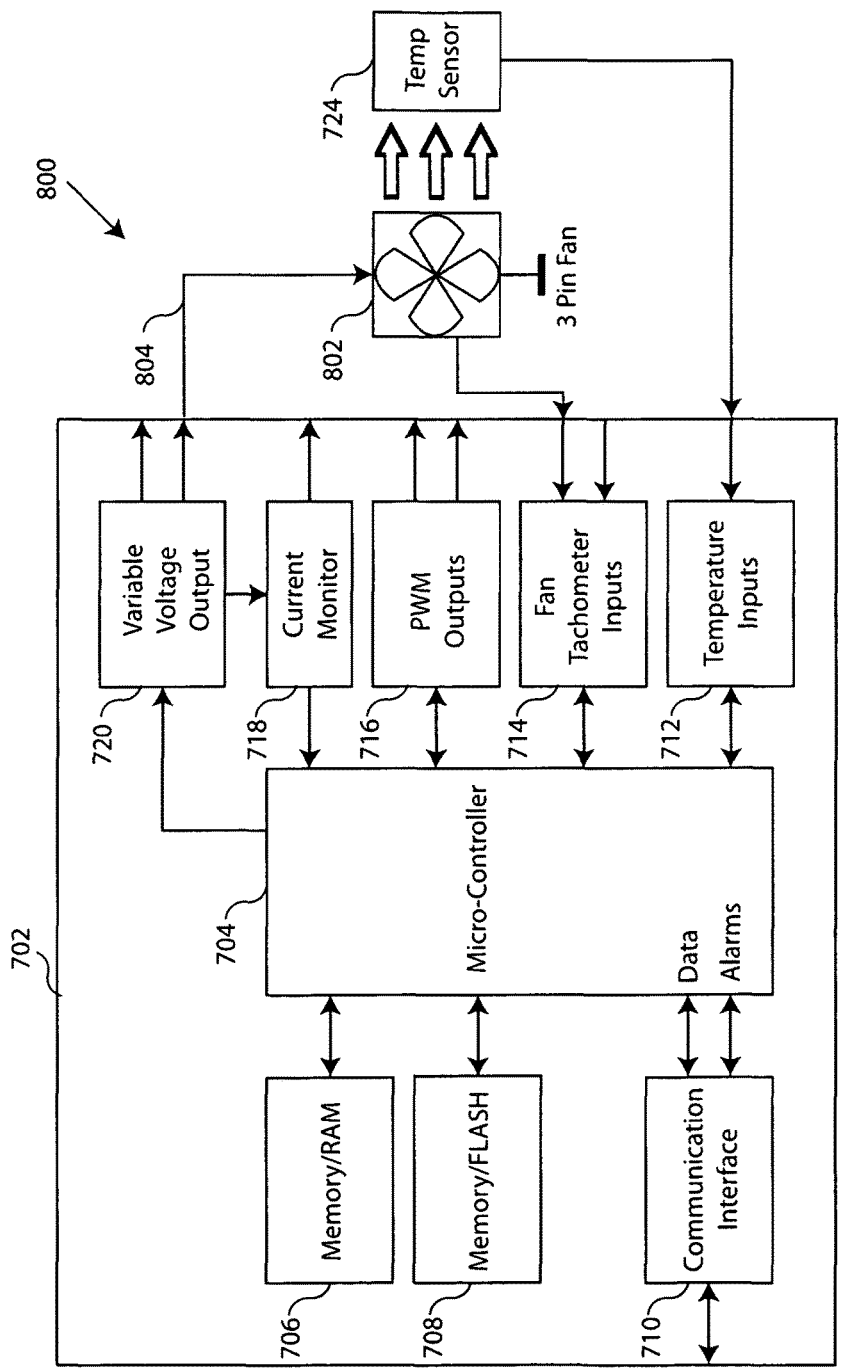
FIG. 8 is a block diagram of an example fan control device connected to a 3 wire fan.

FIG. 8 is a block diagram 800 of an example fan control device 702 connected to a 3 wire fan 802. Three wire fans have two inputs (power, ground) and a tachometer output. Unlike the 4 wire version illustrated by FIG. 7, fan speed of a three wire fan is generally controlled by a variable DC voltage connected to its power input 804. This power is supplied by variable voltage output module 720, which becomes the control signal for three wire fan 802. Thus, in this example, the variable voltage from module 720 takes the place of the PWM output utilized for the 4 wire fan, and a characteristic curve of fan speed versus variable voltage is generated and compared to boundary limits stored in memory.

Figure 9:
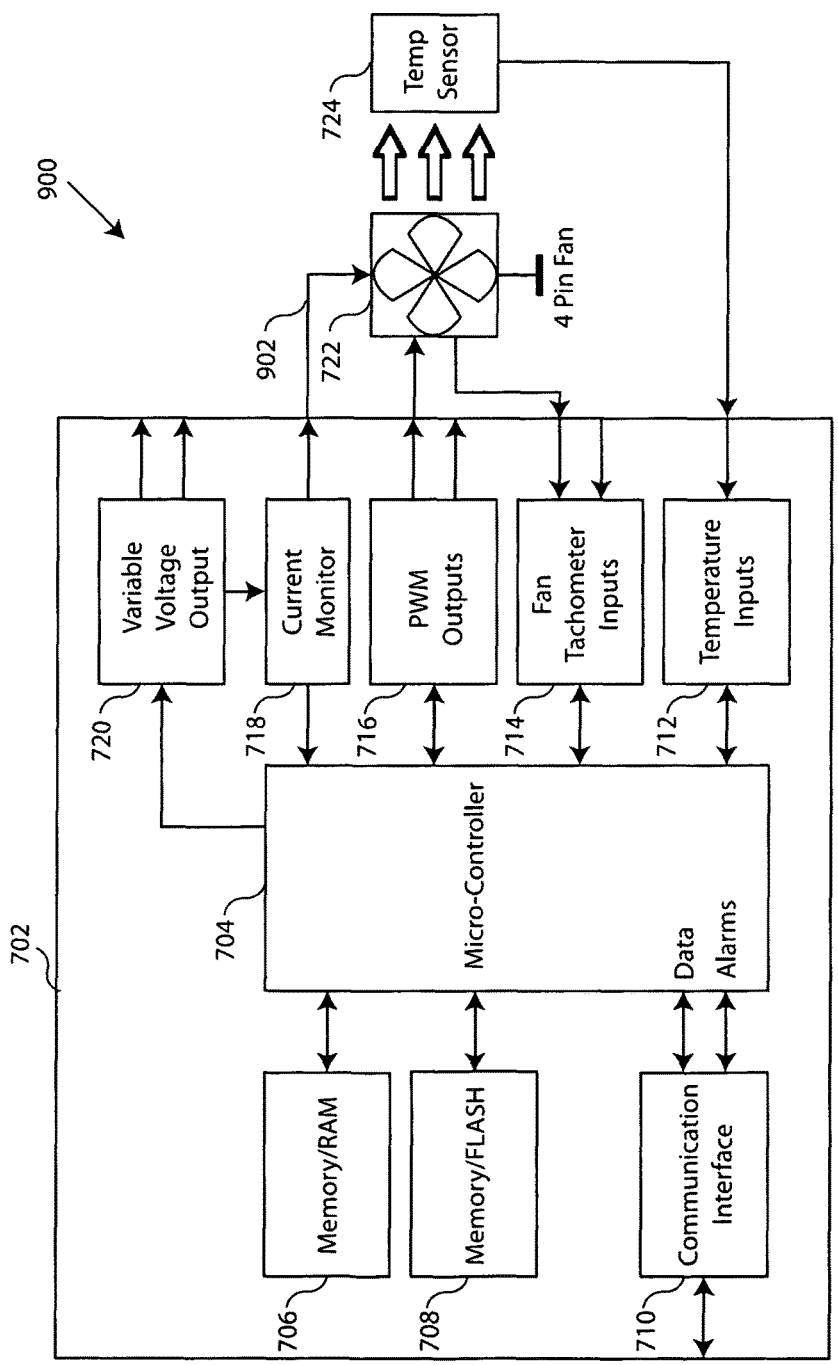
FIG. 9 is a block diagram of an example fan control device configured to measure power delivered to a 4 wire fan.

At times it may be useful to measure the power consumed by a fan, since a fan that is blocked or stalled may consume much higher power levels than normal, signaling a need for immediate attention. For four wire fans, measuring the current drawn by the fan gives a good indication of power consumed:

FIG. 9 is a block diagram 900 of an example fan control device configured to measure power delivered to a 4 wire fan. In this example, power input 902 to 4 wire fan 722 is connected to current measurement module 718, which in turn may be internally connected to variable voltage output module 720, whose output voltage is held approximately constant at $V_{cc}$. The power drawn by the four wire fan is now known by microcontroller 704 and can be combined with the PWM output to create the appropriate characteristic curve. As mentioned previously, this measurement can be used by itself or in conjunction with the other characteristic curves described above. If consumed power exceeds that defined by either tier 1 or tier 2 boundary criteria, an alarm or warning can be generated.

Figure 10:
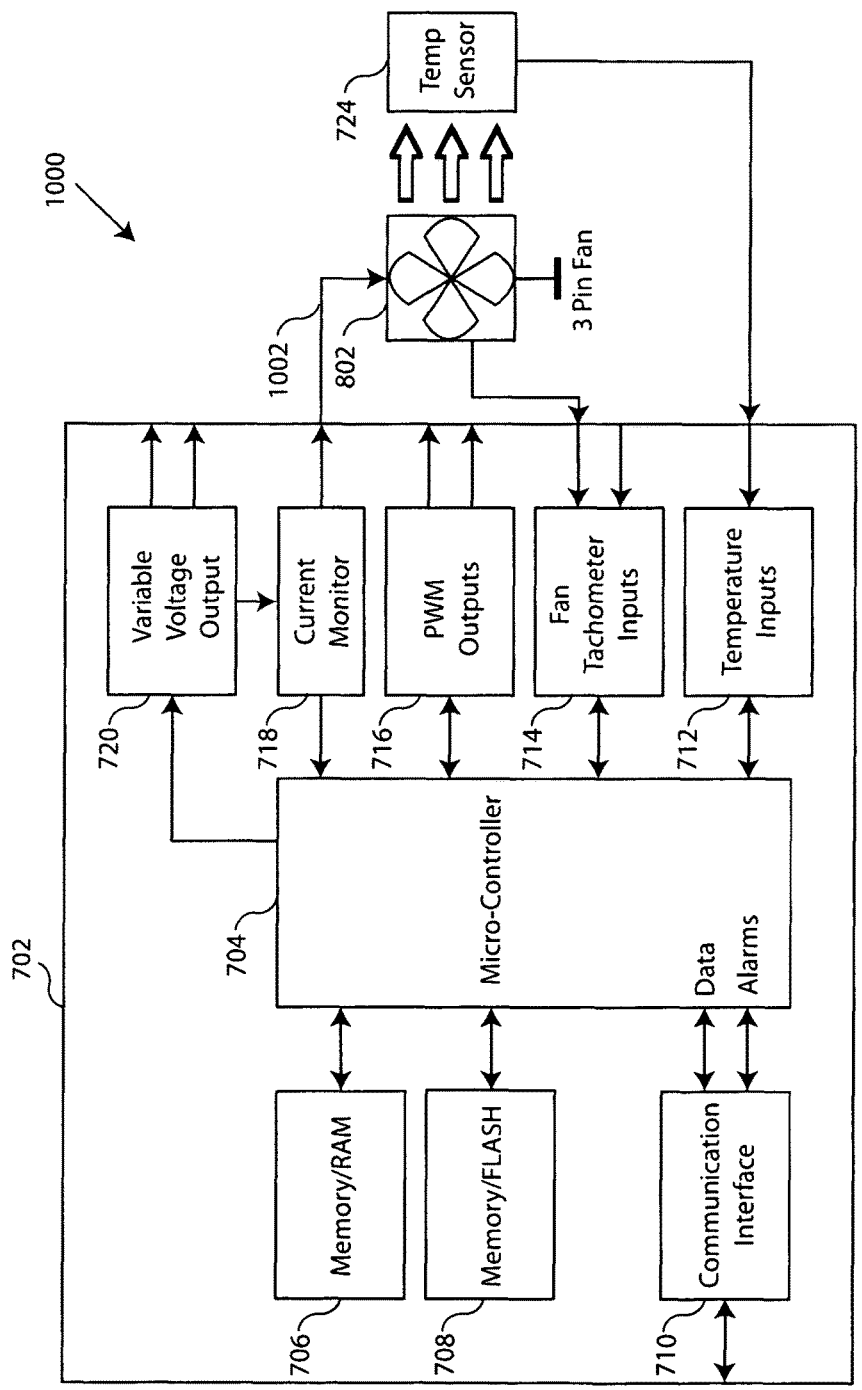
FIG. 10 is a block diagram of an example fan control device configured to measure power delivered to a 3 wire fan.

For the case of three wire fans, the input voltage is varied, so both current and voltage are measured to compute power consumed. FIG. 10 is a block diagram 1000 of an example fan control device configured to measure power delivered to a 3 wire fan. Power input 1002 to 3 wire fan 802 is connected to current measurement module 718, which in turn is connected internally to variable output voltage module 720. Module 720 will vary its voltage to change the speed of fan 802, but since both voltage and current are being measured by microcontroller 704, the power consumed by fan 802 is known.

In non-limiting examples of FIGS. 7-10, a single fan is shown connected to fan control device 702. As will be appreciated by those skilled in the art, the number of fans connected to device 702 can be expanded arbitrarily, limited only by practical considerations of device packaging, memory size, computing power of the microcontroller, etc. Furthermore, a mixture of 4 wire and 3 wire fans may also be accommodated.

Figure 11:
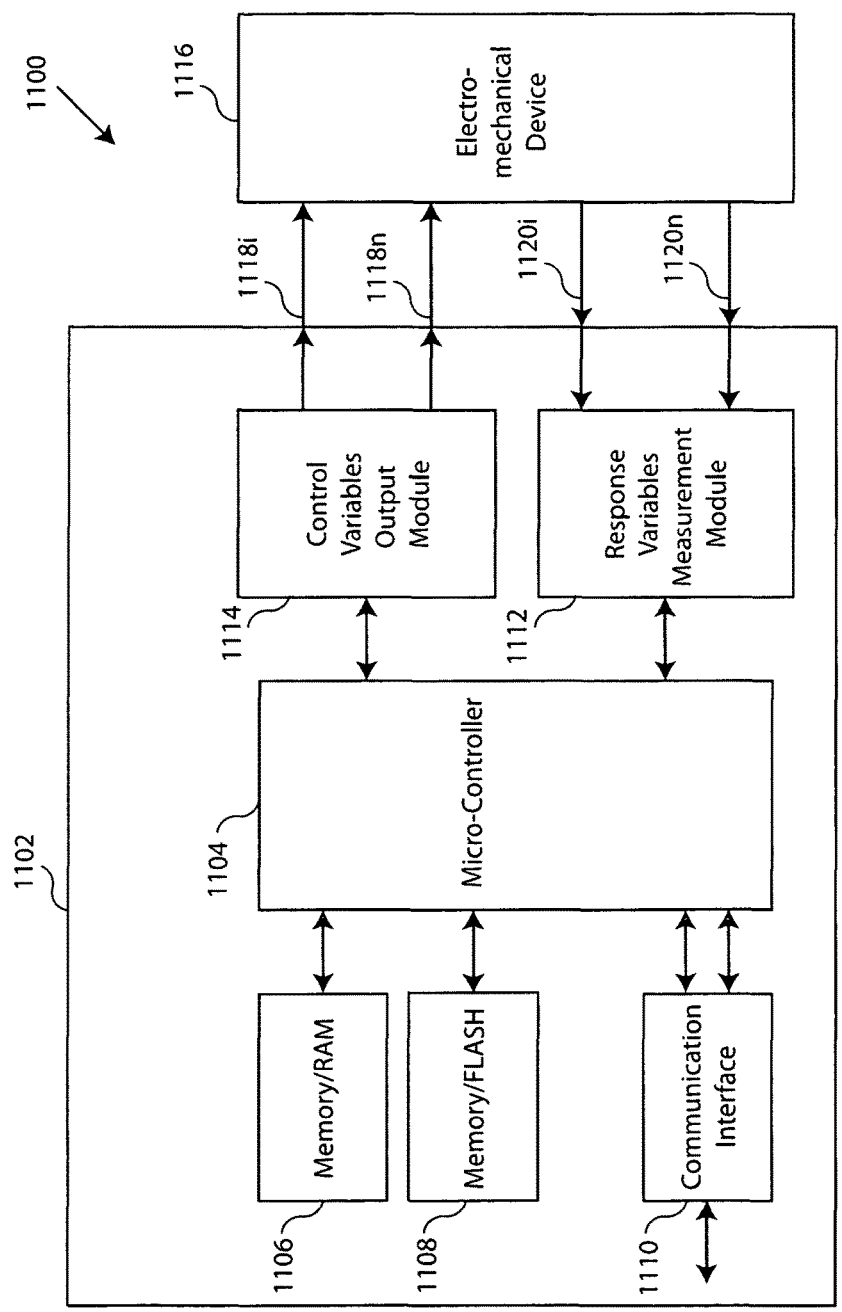
FIG. 11 is a block diagram of an example control device for monitoring the health of an electromechanical device.

FIG. 11 is a block diagram 1100 of an example control device 1102 for monitoring the operating characteristics or "health" of an electromechanical device 1116. Microcontroller 1104 is connected to memory modules 1106, 1108, communication interface module 1110, control variables output module 1114, and response variables input module 1112. Electromechanical device 1116 is connected to module 1114 via one or more outputs 1118i-1118n. These outputs serve to control the actions of the electromechanical device 1116. One or more response measurements from device 1116 are connected to module 1112 via inputs 1120i-1120n. Any number of characteristic curves or transfer functions may be generated from the combination of various inputs and outputs, and boundary criteria may be used in a manner similar to that discussed in reference to FIG. 6 to generate alarms and warnings indicating unsuitable operation of device 1116.

Figure 12:
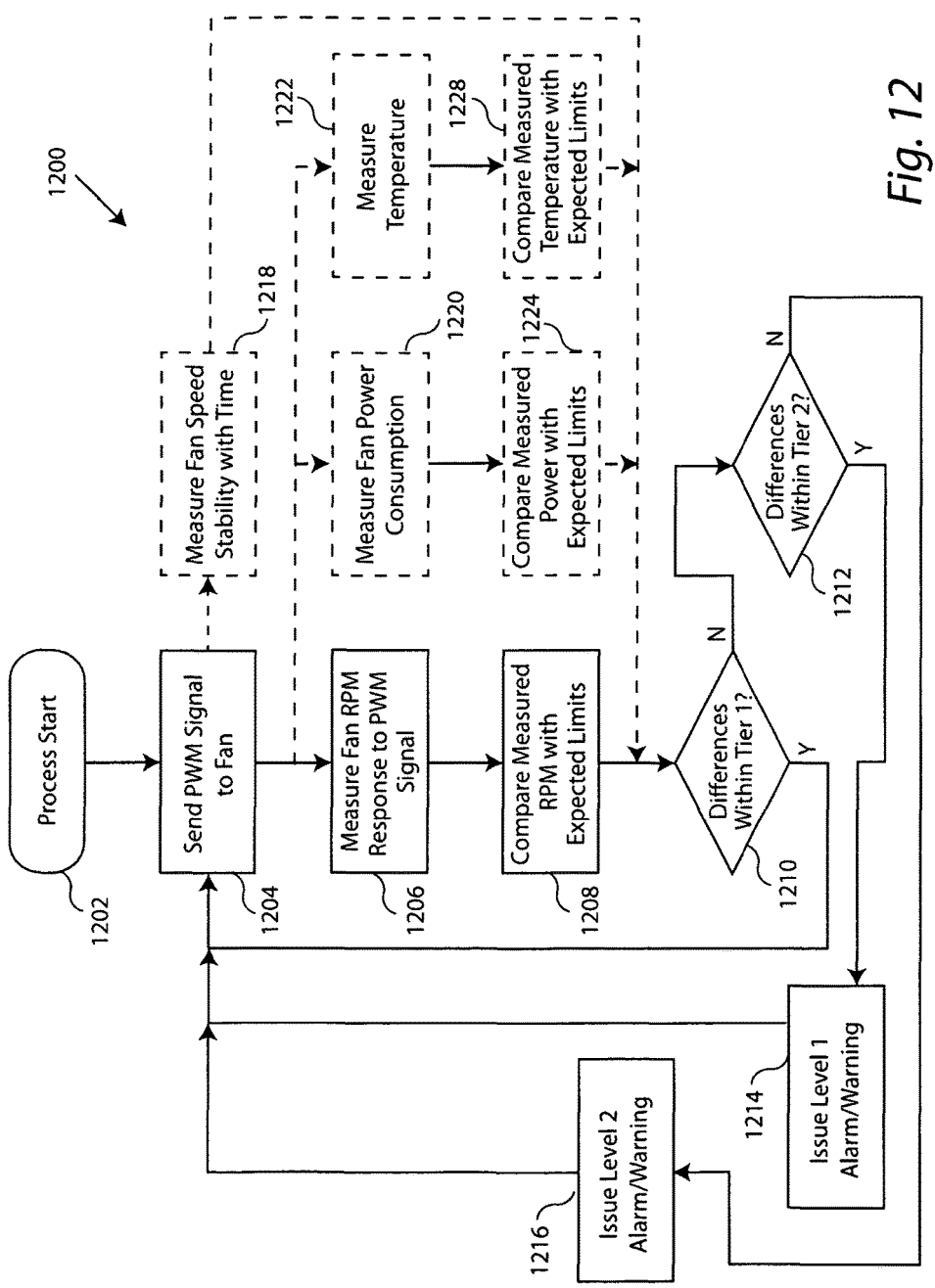
FIG. 12 is an example process diagram for monitoring fans and predicting potential fan failures.

FIG. 12 is an example process diagram 1200 for monitoring fans and predicting potential fan failures. In an operation 1202 the process begins. In an operation 1204, a pulse width modulated (PWM) signal is sent to the fan. Alternatively, for three wire fans, a variable DC voltage is sent to the fan (not shown). In a first example process, in an operation 1206, the fan speed (or fan RPM) is measured in response to the PWM input. Alternatively, for three wire fans, the fan speed (or fan RPM) is measured in response to the voltage input. In an operation 1208, the measured fan speed is compared with the boundary limits. In a decision operation 1210, if the fan speed is within tier 1 boundary limits, the process proceeds back to operation 1204. In a decision operation 1210, if the fan speed is outside tier 1 boundary limits, the process is directed to decision operation 1212. In a decision operation 1212, if the fan speed is within tier 2 boundary limits, the process proceeds to operation 1214, where a tier 1 alarm/warning is issued. In an operation 1212, if the fan speed is outside tier 2 boundary limits, then the process proceeds to operation 1216, where a tier 2 alarm/warning is issued. Subsequent to operations 1212 and 1216 the process is directed back to operation 1204.

In a second example process, subsequent to operation 1204, the process is directed to an operation 1218, where the PWM signal is held constant and the fan speed is measured with respect to time. Alternatively, for three wire fans, the variable DC voltage is held constant and the fan speed is measured with respect to time (not shown). Subsequent to operation 1218, the process is sent to a decision operation 1210, where the process proceeds as described above in the first example.

In a third example process, subsequent to operation 1204, the process is directed to an operation 1220, where fan power consumption is measured. In an operation 1224, the measured power consumption is compared with the boundary limits. Subsequent to operation 1224, the process is sent to a decision operation 1210, where the process proceeds as described above in the first example.

In a fourth example process, subsequent to operation 1204, the process is directed to operation 1222, where temperature is measured. In an operation 1228, the measured temperature is compared with boundary limits. Subsequent to operation 1228, the process is sent to decision operation 1210, where the process proceeds as described above in the first example.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A method for monitoring air cooling fans to diagnose fan operation and predict a potential impending failure condition comprising:
    determining a fan rotation rate transfer function as a function of a control signal;
    determining a first upper boundary limit, a second upper boundary limit, a first lower boundary limit and a second lower boundary limit;
    sending a fan speed control signal to a fan to control its rotational speed;
    measuring a fan rotation rate subsequent to sending the fan speed control signal;
    comparing the measured fan rotation rate to the first upper boundary limit with respect to the fan rotation rate transfer function and the first lower boundary limit with respect to the fan rotation rate transfer function;
    issuing a first alarm if the measured fan rotation rate is at least one of above the first upper boundary limit and below the first lower boundary limit to indicate a potential impending failure condition;
    issuing the first alarm if the measured fan rotation rate is between the first upper boundary limit and the second upper boundary limit with respect to the fan rotation rate transfer function that is greater than the first upper boundary limit;
    issuing the first alarm if the measured fan rotation rate is between the first lower boundary limit and the second lower boundary limit with respect to the fan rotation rate transfer function that is less than the first lower boundary limit; and
    issuing a second alarm if the measured fan rotation rate is at least one of above the second upper boundary limit and below the second lower boundary limit;
    wherein the second alarm indicates the measured fan rotation rate has extended beyond the second upper or second lower boundary limit;
    wherein the first upper boundary limit, the first lower boundary limit and the rotation rate transfer function precede sending the control signal to the fan; and
    wherein the potential impending failure condition is predicted as opposed to detecting the fan has already failed or reached a condition where it is no longer suitable for operation.

2. The method as recited in claim 1, wherein the fan is a four wire fan and the control signal is a pulse width modulated signal.

3. The method as recited in claim 1, wherein the fan is a three wire fan and the control signal is a DC voltage.

4. A method for monitoring air cooling fans to diagnose fan operation and predict a potential impending failure condition comprising:
    sending a control signal to a fan;
    measuring a fan power consumption subsequent to sending the control signal;
    determining a first upper boundary limit, a second upper boundary limit, a first lower boundary limit, and a second lower boundary limit;
    comparing the measured fan power consumption to the first upper boundary limit, and to the second upper boundary limit, and the first lower boundary limit, and the second lower boundary limit;
    issuing a first alarm if the measured fan power consumption is between the first upper boundary limit and the second upper boundary limit;
    issuing the first alarm if the measured fan power consumption is between the first lower boundary limit and the second lower boundary limit; and
    issuing a second alarm if the measured fan power consumption is at least one of above the second upper boundary limit and below the second lower boundary limit;
    wherein the first upper boundary limit, the first lower boundary limit and a fan power consumption transfer function precede sending the control signal to the fan;
    wherein the potential impending failure condition is predicted as opposed to detecting the fan has already failed or reached a condition where it is no longer suitable for operation.

5. The method as recited in claim 4, wherein the fan is a four wire fan and the control signal is a pulse width modulated signal.

6. The method as recited in claim 4, wherein the fan is a three wire fan and the control signal is a DC voltage.

7. An apparatus for monitoring electromechanical devices to diagnose electromechanical device operation and predict a potential impending failure condition comprising:
   a microcontroller;
   an output module coupled to the microcontroller;
   a measurement module coupled to the microcontroller; and
   digital memory coupled to the microcontroller including:
   a) code segments for determining an electromechanical device transfer function as a function of an input signal and for determining a first upper boundary limit, a second upper boundary limit, a first lower boundary limit and a second lower boundary limit;
   b) code segments for sending a control signal to an electromechanical device via the output module;
   c) code segments for measuring the response variable subsequent to sending the control signal;
   d) code segments for comparing the measured response variable to the first upper boundary limit with respect to the electromechanical device transfer function and the first lower boundary limit with respect to the electromechanical device transfer function; and
   e) code segments for issuing a first alarm if the measured response variable is at least one of above the first upper boundary limit and below the first lower boundary limit;
   f) code segments for issuing the first alarm if the measured response variable is between the first upper boundary limit and a second upper boundary limit with respect to the electromechanical device transfer function, the second upper boundary limit being greater than the first upper boundary limit;
   g) code segments for issuing the first alarm if the measured response variable is between the first lower boundary limit and the second lower boundary limit with respect to the electromechanical device transfer function, the second lower boundary limit being less than the first lower boundary limit; and
   h) code segments for issuing a second alarm if the measured response variable is at least one of above the second upper boundary limit and below the second lower boundary limit;
   wherein the second alarm indicates the measured response variable has extended beyond the second upper or second lower boundary limit;
   wherein the first upper boundary limit, the first lower boundary limit and the electromechanical device transfer function precede sending the control signal to the electromechanical device; and
   wherein the potential impending failure condition is predicted as opposed to detecting the electromechanical device has already failed or reached a condition where it is no longer suitable for operation.

8. The apparatus as recited in claim 7, wherein the electromechanical device is selected from among the group of electromechanical devices consisting of pumps, solenoid valves, and motors.

9. The apparatus as recited in claim 7, wherein the response variable is selected from among the group of response variables consisting of speed, power, load current, air temperature, and electromechanical device substrate temperature.

10. The apparatus as recited in claim 8, wherein the electromechanical device is a four wire fan and the control signal is a pulse width modulated signal.

11. The apparatus as recited in claim 8, wherein the electromechanical device is a three wire fan and the control signal is a DC voltage.

* * * * *